(12) United States Patent
Fujita (10) Patent No.: US 11,011,441 B2
(45) Date of Patent: May 18, 2021

(54) MULTILAYER CERAMIC SUBSTRATE AND ELECTRONIC DEVICE

(71) Applicant: Murata Manufacturing Co., Ltd., Nagaokakyo (JP)

(72) Inventor: Seiji Fujita, Nagaokakyo (JP)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 52 days.

(21) Appl. No.: 16/429,140

(22) Filed: Jun. 3, 2019

(65) Prior Publication Data

US 2019/0295911 A1  Sep. 26, 2019

Related U.S. Application Data

(63) Continuation of application No. PCT/JP2017/040930, filed on Nov. 14, 2017.

(30) Foreign Application Priority Data

Dec. 8, 2016 (JP) .............................. JP2016-238525

(51) Int. Cl.
*B32B 3/00* (2006.01)
*H01L 23/15* (2006.01)
*B32B 18/00* (2006.01)
*C04B 35/63* (2006.01)
(Continued)

(52) U.S. Cl.
CPC .............. *H01L 23/15* (2013.01); *B32B 18/00* (2013.01); *C04B 35/63* (2013.01); *H05K 1/0306* (2013.01); *H05K 3/46* (2013.01); *H05K 3/4629* (2013.01); *H05K 3/4688* (2013.01); *C04B 2237/343* (2013.01); *C04B 2237/704* (2013.01); *H05K 2201/068* (2013.01); *Y10T 428/24917* (2015.01)

(58) Field of Classification Search
None
See application file for complete search history.

(56) References Cited

U.S. PATENT DOCUMENTS 5,036,424 A * 7/1991 Yokotani ............... C04B 35/465
361/321.4
6,878,464 B2  4/2005 Moriya et al.
(Continued)

FOREIGN PATENT DOCUMENTS

JP  H-1149531 A * 2/1999
JP  2003201170 A  7/2003
(Continued)

OTHER PUBLICATIONS

International Search Report issued in PCT/JP2017/040930, dated Feb. 6, 2018.
(Continued)

*Primary Examiner* — Seth Dumbris
(74) *Attorney, Agent, or Firm* — Arent Fox LLP (57) ABSTRACT

A multilayer ceramic substrate that includes a first layer positioned at a surface of the multilayer ceramic substrate, a second layer adjacent the first layer and positioned inward of the first layer, and a surface layer electrode disposed on a surface of the first layer. The first layer has a porosity of 13% or less and a maximum pore size of 10 μm or less. The second layer has a porosity of 14% or less and a maximum pore size of 11 μm or less.

17 Claims, 2 Drawing Sheets

(51) Int. Cl.
*H05K 1/03* (2006.01)
*H05K 3/46* (2006.01)

(56) References Cited

U.S. PATENT DOCUMENTS

| | | | |
|---|---|---|---|
| 7,830,240 B2 * | 11/2010 | Mihara | H01C 7/18 338/22 R |
| 7,883,765 B2 | 2/2011 | Sakamoto | |
| 2003/0113554 A1 * | 6/2003 | Umayahara | C04B 35/195 428/446 |
| 2003/0118842 A1 | 6/2003 | Moriya et al. | |
| 2009/0011249 A1 | 1/2009 | Sakamoto | |

FOREIGN PATENT DOCUMENTS

| | | | |
|---|---|---|---|
| JP | 2007073728 A | | 3/2007 |
| JP | 2010034176 A | * | 2/2010 |
| JP | 2012167008 A | | 9/2012 |
| JP | 2016171191 A | | 9/2016 |
| WO | 2007142112 A1 | | 12/2007 |
| WO | 2013146789 A1 | | 10/2013 |

OTHER PUBLICATIONS

Written Opinion of the International Searching Authority issued in PCT/JP2017/040930, dated Feb. 6, 2018.

* cited by examiner

MULTILAYER CERAMIC SUBSTRATE AND ELECTRONIC DEVICE

CROSS REFERENCE TO RELATED APPLICATIONS

The present application is a continuation of International application No. PCT/JP2017/040930, filed Nov. 14, 2017, which claims priority to Japanese Patent Application No. 2016-238525, filed Dec. 8, 2016, the entire contents of each of which are incorporated herein by reference.

FIELD OF THE INVENTION

The present invention relates to a multilayer ceramic substrate and an electronic device.

BACKGROUND OF THE INVENTION

Multilayer ceramic substrates in which wiring conductors are three dimensionally disposed have been widely used for, for example, modules in which a plurality of electronic components, such as semiconductor components, are disposed.

Patent Document 1 discloses a multilayer ceramic substrate having a multilayer structure including an inner layer portion and surface layer portions positioned so as to sandwich the inner layer portion in a stacking direction. When the thermal expansion coefficient of the surface layer portion is expressed as $\alpha1$ [ppmK$^{-1}$] and the thermal expansion coefficient of the inner layer portion is expressed as $\alpha2$ [ppmK$^{-1}$], $0.3 \le \alpha2 - \alpha1 \le 1.5$. A needle-like crystal is crystallized in the inner layer portion.

Patent Document 2 discloses a multilayer ceramic substrate having a multilayer structure including a surface layer portion and an inner layer portion. The thermal expansion coefficient of the surface layer portion is lower than the thermal expansion coefficient of the inner layer portion. The difference in thermal expansion coefficient between the surface layer portion and the inner layer portion is 1.0 ppmK$^{-1}$ or more. The amount of constituent common to the material of the surface layer portion and the material of the inner layer portion is 75 weight % or more.

In the multilayer ceramic substrates in Patent Document 1 and Patent Document 2, the thermal expansion coefficient of the surface layer portion is lower than the thermal expansion coefficient of the inner layer portion. Thus, compressive stress occurs in the outermost layers at the front and the back during a cooling process after firing, thereby improving the flexural strength of the multilayer ceramic substrate.

Patent Document 1: Japanese Unexamined Patent Application Publication No. 2007-73728
Patent Document 2: International Publication No. 2007/142112

SUMMARY OF THE INVENTION

Due to the miniaturization of electronic devices, reduction in the thickness of multilayer ceramic substrates and wires has been promoted. In the multilayer ceramic substrates in Patent Document 1 and Patent Document 2, a layer having a lower thermal expansion coefficient than the inner layer portion is disposed in the surface layer portion. This improves the flexural strength and enables reduction in the thickness of multilayer ceramic substrates. However, in the multilayer ceramic substrates in Patent Document 1 and Patent Document 2, it has been found that pores (voids) may be generated in the surface layer portion and the inner layer portion and disconnection of a surface layer electrode disposed on the surface of the surface layer portion may occur. To promote the reduction in the thickness of multilayer ceramic substrates and wires hereafter, it is necessary that such disconnection of the surface layer electrode be suppressed.

In view of the foregoing, the present invention is achieved. An object of the present invention is to provide a multilayer ceramic substrate in which disconnection of a surface layer electrode is suppressed and in which the insulating properties of the inner layer portion are reliably obtained. Another object of the present invention is to provide an electronic device including the multilayer ceramic substrate.

A multilayer ceramic substrate according to the present invention includes a first layer positioned at the surface of the multilayer ceramic substrate and a second layer adjacent to the first layer and positioned inward of the surface of the multilayer ceramic substrate, and a surface layer electrode disposed on the first layer. The first layer has a porosity of 13% or less and a maximum pore size of 10 μm or less. The second layer has a porosity of 14% or less and a maximum pore size of 11 μm or less.

In the multilayer ceramic substrate of the present invention, the porosity and the maximum pore size of the first layer are decreased, and the porosity and the maximum pore size of the second layer are decreased. Thus, the first layer and the second layer can be densified. As a result, disconnection of a surface layer electrode can be suppressed, and the insulating properties of an inner layer portion can be reliably obtained.

In the multilayer ceramic substrate of the present invention, the first layer preferably has a porosity of 8% or less and a maximum pore size of 7 μm or less. The second layer preferably has a porosity of 9% or less and a maximum pore size of 9 μm or less.

In the multilayer ceramic substrate of the present invention, the thermal expansion coefficient of the first layer is preferably lower than the thermal expansion coefficient of the second layer. Each of the materials of the first layer and the second layer preferably contains glass containing 40 weight % to 65 weight % of MO (MO is at least one selected from CaO, MgO, SrO, and BaO), alumina, and at least one metal oxide selected from CuO and Ag$_2$O. The amount of the alumina is preferably 35 weight % to 60 weight % relative to the total weight of the glass and the alumina. The amount of the metal oxide is preferably 1 weight % to 10 weight % relative to the total weight of the glass and the alumina.

The material of the first layer and the material of the second layer contain a predetermined amount of at least one metal oxide selected from CuO and Ag$_2$O. Thus, vitrification is promoted in the first layer, and the first layer can be densified. As a result, generation of pores in the first layer can be suppressed, and thus, disconnection of the surface layer electrode can be suppressed.

In the multilayer ceramic substrate of the present invention, the amount of the metal oxide in the first layer is preferably larger than the amount of the metal oxide in the second layer.

If the amount of metal oxide in the second layer is excessive, vitrification proceeds excessively in the second layer. Thus, organic constituents cannot be sufficiently degraded during firing, and pores are readily generated in the second layer. In such a case, disconnection of the surface layer electrode can be suppressed; however, the insulating properties of the inner layer portion may be decreased. Therefore, the amount of metal oxide in the first layer is larger than the amount of metal oxide in the second layer, and thus, disconnection of the surface layer electrode can be suppressed, and the insulating properties of the inner layer portion can be reliably obtained.

In the multilayer ceramic substrate of the present invention, when the thermal expansion coefficient of the first layer is expressed as $\alpha 1$ [ppmK$^{-1}$] and the thermal expansion coefficient of the second layer is expressed as $\alpha 2$ [ppmK$^{-1}$], it is preferable that $0.3 \leq \alpha 2 - \alpha 1 \leq 1.5$.

The difference in thermal expansion coefficient, $\alpha 2 - \alpha 1$, is 0.3 or more, and thus, the flexural strength of the multilayer ceramic substrate can be increased. The difference in thermal expansion coefficient, $\alpha 2 - \alpha 1$, is 1.5 or less, and thus, an increase in stress at the interface between the first layer and the second layer can be suppressed, and occurrence of delamination at the interface portion can be suppressed.

An electronic device of the present invention includes the multilayer ceramic substrate.

The present invention provides a multilayer ceramic substrate in which disconnection of the surface layer electrode can be suppressed and in which the insulating properties of the inner layer portion can be reliably obtained.

DETAILED DESCRIPTION OF THE PREFERRED EMBODIMENTS

Hereinafter, a multilayer ceramic substrate and an electronic device, according to the present invention will be described.

However, the present invention is not limited to the following configurations. Various modifications may be appropriately made as long as the gist of the present invention is not changed. A combination of two or more of individual preferred configurations of the present invention described below is also included in the present invention.

Figure 1:
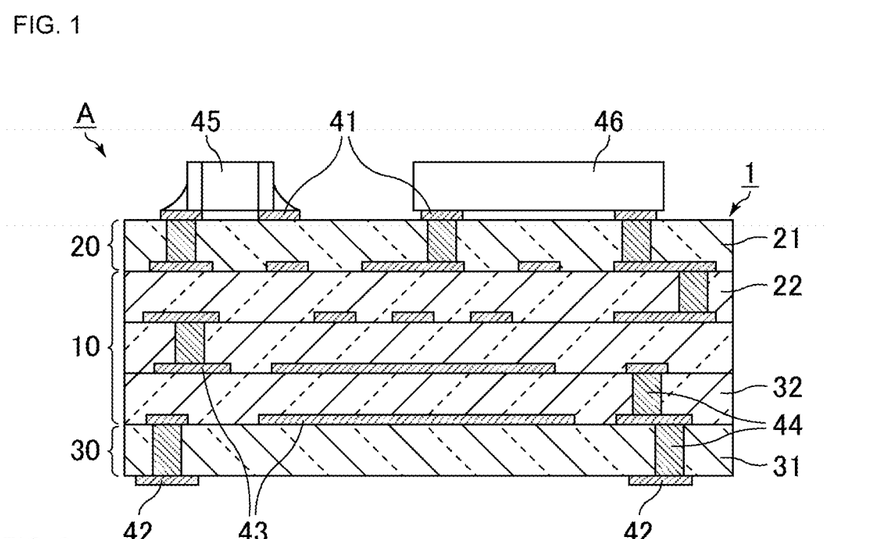
FIG. 1 is a schematic cross-sectional view of an electronic device including a multilayer ceramic substrate according to an embodiment of the present invention.

FIG. 1 is a schematic cross-sectional view of an electronic device including a multilayer ceramic substrate according to an embodiment of the present invention.

A multilayer ceramic substrate 1 has a multilayer structure including an inner layer portion 10 and a first surface layer portion 20 and a second surface layer portion 30 that are positioned so as to sandwich the inner layer portion 10 in the stacking direction.

Each of the inner layer portion 10, the first surface layer portion 20, and the second surface layer portion 30 includes at least one ceramic layer. The first surface layer portion 20 includes a first layer 21 adjacent to the inner layer portion 10, and the second surface layer portion 30 includes a first layer 31 adjacent to the inner layer portion 10. The inner layer portion 10 includes a second layer 22, which is adjacent to the first layer 21 in the first surface layer portion 20, and a second layer 32, which is adjacent to the first layer 31 in the second surface layer portion 30.

The multilayer ceramic substrate 1 includes wiring conductors. Wiring conductors are included in passive elements, such as capacitors and inductors, or used to establish connection such as an electrical connection between elements. As illustrated, the wire conductors typically include surface layer electrodes 41 and 42, inner conductors 43, and via-hole conductors 44. In such wiring conductors, Ag, Cu, Au, a Ag—Pd alloy, or a Ag—Pt alloy is preferably contained as a main constituent, and more preferably, Ag is contained as a main constituent.

The surface layer electrodes 41 are formed on one main surface of the multilayer ceramic substrate 1, and the surface layer electrodes 42 are formed on the other main surface of the multilayer ceramic substrate 1. The inner conductors 43 are formed inside the multilayer ceramic substrate 1 and disposed between the ceramic layers. The via-hole conductors 44 are electrically connected to any of the surface layer electrodes 41 and 42 and the inner conductors 43 and disposed so as to pass through a ceramic layer in the thickness direction.

A multilayer ceramic capacitor 45 and a semiconductor component 46, which are each a chip-like electronic component, are mounted on one main surface of the multilayer ceramic substrate 1 in a state of being electrically connected to the surface layer electrodes 41. This forms an electronic device A including the multilayer ceramic substrate 1. The surface layer electrodes 42 formed on the other main surface of the multilayer ceramic substrate 1 are used to establish an electrical connection when the electronic device A is mounted on a motherboard not illustrated.

In the multilayer ceramic substrate of the present invention, the first layer has a porosity of 13% or less. The first layer preferably has a porosity of 8% or less. The first layer preferably has a porosity of 1% or more.

In the multilayer ceramic substrate of the present invention, the first layer has a maximum pore size of 10 μm or less. The first layer preferably has a maximum pore size of 7 μm or less. The first layer preferably has a maximum pore size of 1 μm or more.

In the multilayer ceramic substrate of the present invention, the first layer has a porosity of 13% or less and a maximum pore size of 10 μm or less. The first layer preferably has a porosity of 8% or less and a maximum pore size of 7 μm or less.

In the multilayer ceramic substrate of the present invention, the second layer has a porosity of 14% or less. The second layer preferably has a porosity of 9% or less. The second layer preferably has a porosity of 2% or more.

In the multilayer ceramic substrate of the present invention, the second layer has a maximum pore size of 11 μm or less. The second layer preferably has a maximum pore size of 9 μm or less. The second layer preferably has a maximum pore size of 2 μm or more.

In the multilayer ceramic substrate of the present invention, the second layer has a porosity of 14% or less and a maximum pore size of 11 μm or less. The second layer preferably has a porosity of 9% or less and a maximum pore size of 9 μm or less.

The porosity and the maximum pore size are determined by observing the cross sections of the first layer and the second layer by using SEM. The porosity is the area percentage of pores in a visual field. The maximum pore size is the diameter of the maximum pore in a visual field.

When the surface layer portion includes a ceramic layer in addition to the first layer, the ceramic layer other than the first layer may have any porosity and any maximum pore size. However, it is preferable that at least the outermost surface have a porosity of 13% or less and a maximum pore size of 10 μm or less. It is more preferable that all ceramic layers included in the surface layer portion have a porosity of 13% or less and a maximum pore size of 10 μm or less. When the inner layer portion includes a ceramic layer in addition to the second layer, the ceramic layer other than the second layer may have any porosity and any maximum pore size. However, it is preferable that all ceramic layers included in the inner layer portion have a porosity of 14% or less and a maximum pore size of 11 μm or less.

In the multilayer ceramic substrate of the present invention, the thermal expansion coefficient of the first layer is preferably less than the thermal expansion coefficient of the second layer. When the thermal expansion coefficient of the first layer is expressed as $\alpha 1$ [ppmK$^{-1}$] and the thermal expansion coefficient of the second layer is expressed as $\alpha 2$ [ppmK$^{-1}$], it is preferable that $0.3 \le \alpha 2 - \alpha 1 \le 1.5$. The lower limit of $\alpha 2 - \alpha 1$, the difference in thermal expansion coefficient, is more preferably 0.4, still more preferably 0.5, and particularly preferably 0.6. The upper limit of $\alpha 2 - \alpha 1$ is more preferably 1.4, and still more preferably 1.3.

The thermal expansion coefficient is determined by thermomechanical analysis (TMA) with the temperature raised from the room temperature to 500° C. at a rate of 5° C./min.

The lower limit of the thermal expansion coefficient of the first layer, $\alpha 1$, is preferably 5.0 ppmK$^{-1}$ and more preferably 5.3 ppmK$^{-1}$. The upper limit of $\alpha 1$ is preferably 8.0 ppmK$^{-1}$ and more preferably 7.7 ppmK$^{-1}$. The lower limit of the thermal expansion coefficient of the second layer, $\alpha 2$, is preferably 5.5 ppmK$^{-1}$ and more preferably 5.7 ppmK$^{-1}$. The upper limit of $\alpha 2$ is preferably 8.5 ppmK$^{-1}$ and more preferably 8.0 ppmK$^{-1}$.

As will be described later, a mixture of a glass, alumina, and a metal oxide is used as the material of the surface-layer-portion ceramic layer in the surface layer portion and as the material of the inner-layer-portion ceramic layer in the inner layer portion. Changing the ratio of glass, alumina, and a metal oxide or changing the type of the glass and/or the type of the metal oxide enables adjustment of the thermal expansion coefficient of the first layer and the thermal expansion coefficient of the second layer.

Each of the materials of the first layer and the second layer contains glass. Specifically, each of the glass contained in the first layer and the glass contained in the second layer preferably contains 40 weight % to 65 weight % of MO (MO is at least one selected from a group consisting of CaO, MgO, SrO, and BaO) relative to the weight of the total glass.

Each of the glass contained in the first layer and the glass contained in the second layer preferably further contains $Al_2O_3$, $B_2O_3$, and $SiO_2$.

Adjusting the composition of the glass and the amount of each constituent in the material of the first layer enables adjustment of the thermal expansion coefficient of the first layer. Adjusting the composition of the glass and the amount of each constituent in the material of the second layer enables adjustment of the thermal expansion coefficient of the second layer.

The percentages of the constituents of the glass in the first layer are preferably as follows:

MO (preferably CaO): 40 weight % to 55 weight %, more preferably 41 weight % to 50 weight %;
$Al_2O_3$: 0 weight % to 10 weight %, more preferably 3 weight % to 8.5 weight %;
$B_2O_3$: 0 weight % to 20 weight %, more preferably 3 weight % to 15 weight %;
$SiO_2$: 25 weight % to 70 weight %, more preferably 30 weight % to 60 weight %.

The percentages of the constituents of the glass in the second layer are preferably as follows:

MO (preferably CaO): 40 weight % to 55 weight %, more preferably 41 weight % to 50 weight %;
$Al_2O_3$: 0 weight % to 10 weight %, more preferably 3 weight % to 8.5 weight %;
$B_2O_3$: 0 weight % to 20 weight %, more preferably 3 weight % to 15 weight %;
$SiO_2$: 25 weight % to 70 weight %, more preferably 30 weight % to 60 weight %.

The glass contained in the first layer and the glass contained in the second layer may contain impurities, and in such a case, the amount of impurities is preferably less than 5 weight %.

Alumina ($Al_2O_3$) is preferably contained as a ceramic filler in each of the materials of the first layer and the second layer. The $Al_2O_3$ filler improves mechanical strength.

Each of the materials of the first layer and the second layer preferably contains 35 weight % to 60 weight % of alumina relative to the total weight of the glass and the alumina.

The material of the first layer more preferably contains 48 weight % to 60 weight % of alumina relative to the total weight of the glass and the alumina. The material of the second layer more preferably contains 48 weight % to 60 weight % of alumina relative to the total weight of the glass and the alumina.

Furthermore, each of the materials of the first layer and the second layer preferably contains at least one metal oxide selected from a group consisting of CuO and $Ag_2O$. Each of the materials of the first layer and the second layer more preferably contains CuO or $Ag_2O$. In such a case, one of the materials of the first layer and the second layer may contain CuO and the other may contain $Ag_2O$; however, both materials preferably contain the same metal oxide. Each of CuO and $Ag_2O$ has a metal element (Cu or Ag) common to the element that may be contained in the wiring conductors. It is not necessary that the materials of the first layer and the second layer contain a metal oxide having the same metal element as the wiring conductors. For example, when Ag is the main constituent in the wiring conductors, the materials of the first layer and the second layer may contain CuO.

Each of the materials of the first layer and the second layer preferably contains 1 weight % to 10 weight % of the metal oxide relative to the total weight of the glass and the alumina. The amount of metal oxide in the first layer is preferably larger than the amount of metal oxide in the second layer.

The material of the first layer more preferably contains 3 weight % to 5 weight % of the metal oxide relative to the total weight of the glass and the alumina. The material of the second layer more preferably contains 1 weight % to 2 weight % of the metal oxide relative to the total weight of the glass and the alumina.

In particular, the material of the first layer preferably contains 48 weight % to 60 weight % of alumina and 3 weight % to 5 weight % of the metal oxide relative to the total weight of the glass and the alumina. The material of the second layer preferably contains 48 weight % to 60 weight % of alumina and 1 weight % to 2 weight % of the metal oxide relative to the total weight of the glass and the alumina.

The materials of the first layer and the second layer may contain another ceramic filler, such as $ZrO_2$ in addition to $Al_2O_3$, CuO, and $Ag_2O$.

When the surface layer portion includes a ceramic layer in addition to the first layer, the ceramic layer other than the first layer may contain a material that differs from the material of the first layer; however, it is preferable that at least the outermost surface layer contain the same material as the first layer, and it is more preferable that all ceramic layers included in the surface layer portion contain the same material as the first layer.

When the inner layer portion includes a ceramic layer in addition to the second layer, the ceramic layer other than the second layer may contain a material that differs from the material of the second layer; however, it is preferable that all ceramic layers included in the inner layer portion contain the same material as the second layer.

In the multilayer ceramic substrate 1 illustrated in FIG. 1, the surface layer electrodes 41 are disposed on the surface of the first surface layer portion 20, the surface layer electrodes 42 are disposed on the second surface layer portion 30, and the first surface layer portion 20 and the second surface layer portion 30 have the first layer 21 and the first layer 31, respectively. In the multilayer ceramic substrate of the present invention, a surface layer electrode is disposed on the surface of at least one of the surface layer portions, and a surface layer portion on which the surface layer electrode is disposed has the first layer.

The multilayer ceramic substrate 1 illustrated in FIG. 1 is preferably produced as follows.

Figure 2:
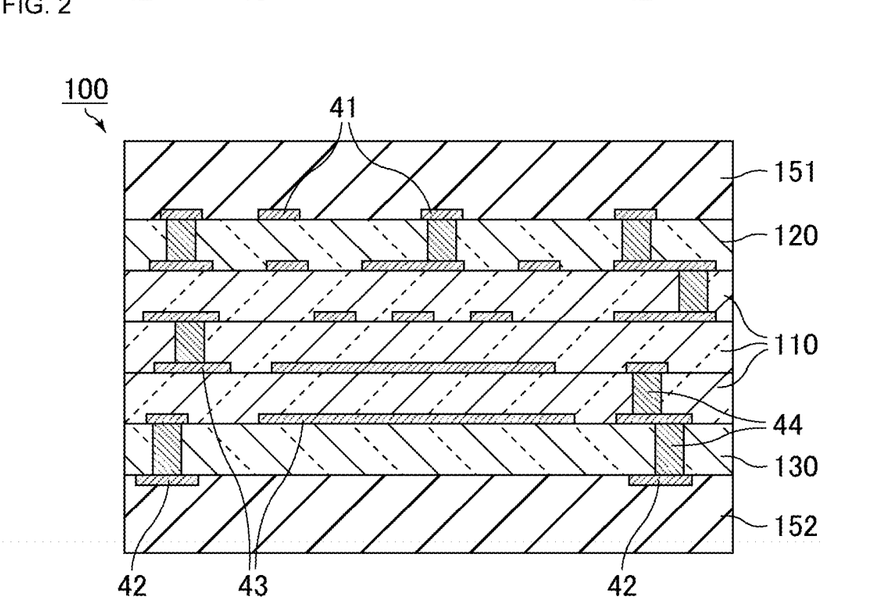
FIG. 2 is a schematic cross-sectional view of a composite laminate produced during production of the multilayer ceramic substrate in FIG. 1.

FIG. 2 is a schematic cross-sectional view of a composite laminate produced during production of the multilayer ceramic substrate in FIG. 1.

A composite laminate 100 includes inner-layer ceramic green sheets 110, which are to form the inner layer portion 10 in the multilayer ceramic substrate 1, surface-layer ceramic green sheets 120 and 130, which are to be the surface layer portions 20 and 30 in the multilayer ceramic substrate 1, and restricting ceramic green sheets 151 and 152. In or on the inner-layer ceramic green sheets 110 and the surface-layer ceramic green sheets 120 and 130, the surface layer electrodes 41 and 42, the inner conductors 43, and the via-hole conductors 44 are disposed as the wiring conductors included in the multilayer ceramic substrate 1. In this stage, such wiring conductors are formed of an unsintered conductor paste.

To produce the composite laminate 100, the inner-layer ceramic green sheet 110, the surface-layer ceramic green sheets 120 and 130, and the restricting ceramic green sheets 151 and 152 are each prepared.

The compositions of the surface-layer ceramic green sheets 120 and 130 are determined such that the sintered bodies of the surface-layer ceramic green sheets 120 and 130, which are to be the first layers, has a porosity of 13% or less and a maximum pore size of 10 μm or less. Furthermore, the composition of the inner-layer ceramic green sheet 110 is determined such that the sintered body of the inner-layer ceramic green sheet 110, which is to be the second layer, has a porosity of 14% or less and a maximum pore size of 11 μm or less.

The restricting ceramic green sheets 151 and 152 have a composition in which an inorganic material (e.g., $Al_2O_3$) is a main constituent. Such an inorganic material is not sintered at a temperature at which the inner-layer ceramic green sheet 110 and the surface-layer ceramic green sheets 120 and 130 are sintered.

Next, the surface-layer ceramic green sheets 120 and 130 are disposed so as to sandwich at least one inner-layer ceramic green sheet 110 in the stacking direction. Furthermore, the restricting ceramic green sheet 151 is disposed on the outer side portion of the surface-layer ceramic green sheet 120, and the restricting ceramic green sheet 152 is disposed on the outer side portion of the surface-layer ceramic green sheet 130, thereby producing the composite laminate 100 illustrated in FIG. 2.

Subsequently, the composite laminate 100 is fired at a temperature at which the surface-layer ceramic green sheets 120 and 130 and the inner-layer ceramic green sheet 110 are sintered and at which the restricting ceramic green sheets 151 and 152 are not sintered. As a result, the composite laminate 100 is obtained after firing. In the composite laminate 100, the first layers 21 and 31 (see FIG. 1) derived from the surface-layer ceramic green sheets 120 and 130 have a porosity of 13% or less and a maximum pore size of 10 μm or less, and the second layers 22 and 32 (see FIG. 1) derived from the inner-layer ceramic green sheets 110 have a porosity of 14% or less and a maximum pore size of 11 μm or less.

Thereafter, from the composite laminate 100 after firing, the portions derived from the restricting ceramic green sheets 151 and 152 are removed. This provides the multilayer ceramic substrate 1.

According to the above production method, the composite laminate including a restricting ceramic green sheet disposed on each main surface is fired. Thus, shrinkage of the surface-layer ceramic green sheets and inner-layer ceramic green sheets in a direction of each main surface can be suppressed during firing. This leads to suppression of undesired deformation of the multilayer ceramic substrate and to improvement of dimension accuracy. Furthermore, delamination is unlikely to occur between the surface layer portion and the inner layer portion during firing.

On the other hand, when the composite laminate including a restricting ceramic green sheet disposed on each surface is fired, typically, a glass constituent in the surface-layer ceramic green sheet is readily absorbed into the restricting ceramic green sheet, and thus, pores may be generated in the surface layer portion. When the surface-layer ceramic green sheet, which is to be the first layer, and the inner-layer ceramic green sheet, which is to be the second layer, contain a predetermined amount of at least one metal oxide selected from a group consisting of CuO and $Ag_2O$, vitrification is promoted in the first layer, and the first layer can be densified. As a result, generation of pores in the first layer can be suppressed, and thus, disconnection of the surface layer electrode can be suppressed.

In production of the multilayer ceramic substrate 1, instead of a laminate including the above-described restricting ceramic green sheets 151 and 152, a laminate having no restricting ceramic green sheets may be fired. In such a case, disconnection of the surface layer electrode can also be suppressed.

EXAMPLES

Hereinafter, more specific examples of the multilayer ceramic substrate of the present invention will be described. The present invention is not limited to such examples.
(Production Method of Multilayer Ceramic Substrate)
First, $SiO_2$—CaO—$B_2O_3$—$Al_2O_3$-based glass powders having compositions described in Table 1 were prepared.

TABLE 1

| Glass symbol | CaO (weight %) | $Al_2O_3$ (weight %) | $B_2O_3$ (weight %) | $SiO_2$ (weight %) |
|---|---|---|---|---|
| G1 | 45 | 7 | 6 | 42 |
| G2 | 47 | 4 | 11 | 38 |
| G3 | 50 | 3 | 14 | 33 |

Next, to obtain samples in Table 2, surface-layer ceramic green sheets and inner-layer ceramic green sheets were produced.

To obtain each sample in Table 2, to a powder mixture containing a glass powder, an alumina ($Al_2O_3$) powder, and a metal oxide powder of CuO or $Ag_2O$, a solvent, a dispersant, a binder, and a plasticizing agent were added and mixed together to obtain a slurry. The obtained slurry was applied to a PET film to produce a surface-layer ceramic green sheet or an inner-layer ceramic green sheet.

Table 2 describes the type and amount of glass powder, the amount of $Al_2O_3$ powder, and the amount of metal oxide powder, which are contained in the surface-layer ceramic green sheet and the inner-layer ceramic green sheet. The symbols, "G1" to "G3", described in the type of glass in Table 2 correspond to the grass symbols in Table 1. As described in Table 2, the weight ratio of glass powder to $Al_2O_3$ powder was adjusted to 46:54 to 60:40. The thickness of the surface-layer ceramic green sheet was adjusted such that the first layer (surface layer) would have a thickness described in Table 2 after firing. The thickness of the inner-layer ceramic green sheet was adjusted such that the second layer (inner layer) would have a thickness described in Table 2 after firing.

Separately from the above, a solvent, a dispersant, a binder, and a plasticizing agent were added to the $Al_2O_3$ powder and mixed together to obtain a slurry. The obtained slurry was applied to a PET film to obtain a restricting ceramic green sheet having a thickness of 50 μm.

A Ag powder, a solvent, and an organic binder were mixed together at a predetermined ratio, and the mixture was subjected to dispersion treatment by using a three-roller mill to obtain a Ag paste.

Next, a certain surface ceramic green sheet and a certain internal ceramic green sheet were subjected to a via-hole processing by using a laser puncher. Thereafter, the Ag paste was placed to form a paste body that is to be a via-hole conductor. The Ag paste was applied to a certain surface-layer ceramic green sheet and a certain inner-layer ceramic green sheet by screen printing to form paste patterns that are to be a surface layer electrode and an inner conductor. A plurality of such surface-layer ceramic green sheets and inner-layer ceramic green sheets were stacked on each other, and the restricting ceramic green sheets were each disposed on the top and bottom of the stack. Then, the stack was pressured to produce a composite laminate.

The composite laminate, which had been produced, was fired at a temperature at which the surface ceramic green sheet, the inner ceramic green sheet, and the Ag paste were sintered and at which the restricting ceramic green sheet was not sintered. After firing, the unsintered portion derived from the restricting ceramic green sheet was removed to produce a multilayer ceramic substrate for evaluation.

Figure 3:
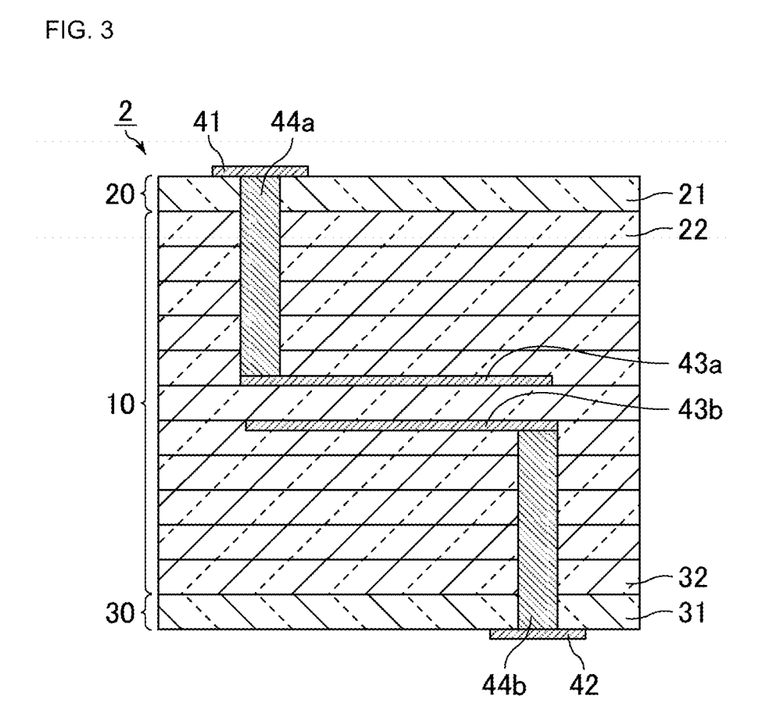
FIG. 3 is a schematic cross-sectional view of a multilayer ceramic substrate for evaluation.

FIG. 3 is a schematic cross-sectional view of a multilayer ceramic substrate for evaluation.

A multilayer ceramic substrate 2 for evaluation has a multilayer structure in which the first layer 21 in the surface layer portion 20 is bonded to the second layer 22 positioned at the top surface of the inner layer portion 10 and in which the first layer 31 in the surface layer portion 30 is bonded to the second layer 32 positioned at the bottom surface of the inner layer portion 10. In the substrate, two via-hole conductors 44a and 44b are formed. The via-hole conductor 44a is connected to the surface layer electrode 41 formed on the first layer 21 at the top of the substrate and to an inner conductor 43a formed between layers in the inner layer portion 10. The via-hole conductor 44b is connected to the surface layer electrode 42 formed on the first layer 31 at the bottom of the substrate and to an inner conductor 43b formed between layers in the inner layer portion 10. The inner conductor 43a connected to the via-hole conductors 44a is away from the inner conductor 43b connected to the via-hole conductors 44b by the thickness of a single ceramic layer in the inner layer portion 10.

TABLE 2

| | First layer (Surface layer) | | | | | Second layer (Inner layer) | | | | | |
|---|---|---|---|---|---|---|---|---|---|---|---|
| | Glass | $Al_2O_3$ | CuO | $Ag_2O$ | | Glass | $Al_2O_3$ | CuO | $Ag_2O$ | | Thickness |
| | Type | Parts by weight | Parts by weight | Parts by weight | Parts by weight | Thickness μm | Type | Parts by weight | Parts by weight | Parts by weight | Parts by weight | ness μm |
| Comparative Example 1 | G1 | 48 | 52 | — | — | 12.0 | G1 | 52 | 48 | — | — | 11.0 |
| Comparative Example 2 | G1 | 48 | 52 | 1 | — | 12.0 | G1 | 52 | 48 | — | — | 11.0 |
| Example 1 | G1 | 48 | 52 | 3 | — | 12.0 | G1 | 52 | 48 | 1 | — | 11.0 |
| Example 2 | G1 | 48 | 52 | 3 | — | 12.0 | G1 | 52 | 48 | 3 | — | 11.0 |
| Comparative Example 3 | G1 | 48 | 52 | 3 | — | 12.0 | G1 | 52 | 48 | 4 | — | 11.0 |
| Example 3 | G3 | 60 | 40 | 3 | — | 12.0 | G1 | 60 | 40 | 1 | — | 11.0 |
| Example 4 | G3 | 46 | 54 | 5 | — | 12.0 | G1 | 46 | 54 | 2 | — | 11.0 |
| Example 5 | G1 | 48 | 52 | 5 | — | 12.0 | G1 | 52 | 48 | 2 | — | 11.0 |
| Example 6 | G1 | 48 | 52 | 5 | — | 12.0 | G2 | 52 | 48 | 2 | — | 11.0 |
| Example 7 | G1 | 48 | 52 | 5 | — | 12.0 | G3 | 52 | 48 | 2 | — | 11.0 |
| Example 8 | G1 | 48 | 52 | 5 | — | 12.0 | G1 | 50 | 50 | 2 | — | 11.0 |
| Example 9 | G1 | 48 | 52 | 5 | — | 12.0 | G3 | 50 | 50 | 2 | — | 11.0 |
| Example 10 | G3 | 48 | 52 | 5 | — | 12.0 | G1 | 52 | 48 | 2 | — | 11.0 |
| Example 11 | G3 | 48 | 52 | 5 | — | 12.0 | G1 | 50 | 50 | 2 | — | 11.0 |
| Example 12 | G3 | 50 | 50 | 5 | — | 12.0 | G1 | 50 | 50 | 1 | — | 11.0 |
| Example 13 | G3 | 48 | 52 | 5 | — | 12.0 | G1 | 48 | 52 | 2 | — | 11.0 |
| Example 14 | G3 | 52 | 48 | 5 | — | 12.0 | G1 | 52 | 48 | 2 | — | 11.0 |
| Example 15 | G1 | 48 | 52 | 10 | — | 12.0 | G1 | 52 | 48 | 2 | — | 11.0 |
| Comparative Example 4 | G1 | 48 | 52 | 11 | — | 12.0 | G1 | 52 | 48 | 2 | — | 11.0 |
| Comparative Example 5 | G1 | 48 | 52 | — | 1 | 12.0 | G1 | 52 | 48 | — | — | 11.0 |
| Example 16 | G1 | 48 | 52 | — | 3 | 12.0 | G1 | 52 | 48 | — | 1 | 11.0 |
| Example 17 | G1 | 48 | 52 | — | 5 | 12.0 | G1 | 52 | 48 | — | 2 | 11.0 |
| Comparative Example 6 | G1 | 48 | 52 | — | 5 | 12.0 | G1 | 52 | 48 | — | 4 | 11.0 |
| Example 18 | G1 | 48 | 52 | — | 10 | 12.0 | G1 | 52 | 48 | — | 2 | 11.0 |
| Comparative Example 7 | G1 | 48 | 52 | — | 11 | 12.0 | G1 | 52 | 48 | — | 2 | 11.0 |

(Evaluation of Multilayer Ceramic Substrate)

Regarding the multilayer ceramic substrates for evaluation, "difference in thermal expansion coefficient", "porosity", "maximum pore size", "insulating property of inner layer portion", "disconnection of surface layer electrode", "flexural strength", and "delamination" were evaluated. The evaluation results are summarized in Table 3.

"Difference in thermal expansion coefficient" was determined from the thermal expansion coefficient of the first layer, α1, and the thermal expansion coefficient of the second layer, α2, of the multilayer ceramic substrate for evaluation.

The thermal expansion coefficient was measured by thermomechanical analysis (TMA) under the following conditions with the temperature raised from the room temperature to 500° C. at a rate of 5° C./min.

measurement atmosphere: nitrogen (300 mL/min)
measurement load: 10 gf

"Porosity" and "maximum pore size" were determined by observing a cross section of the multilayer ceramic substrate by using SEM.

Specifically, a multilayer ceramic substrate that had been fired was cut into a predetermined size, embedded in an epoxy resin in which a curing agent was mixed, and cured. Thereafter, polishing was performed to expose a cross section, and the cross sections of the first layer and the second layer were observed at a magnification of 500×.

Regarding "insulating property of inner layer portion", an insulating property test was performed with the surface layer electrodes, which were at the top and bottom of the multilayer ceramic substrate for evaluation, used as terminals. In a pressure cooker test, a direct voltage of 50 V was applied, and the insulation resistance was determined after 200 hours. The test condition was 121° C. and 85% RH. A direct voltage of 50 V was applied for 60 seconds to a sample that had been subjected to the pressure cooker test, and the leakage current was measured. A sample showing Log IR≥10 was evaluated as G (Good), and a sample showing Log IR<10 was evaluated as P (Poor). As described in Table 2, after firing, the ceramic layer sandwiched by the inner conductors, which is used for measuring the insulation resistance, has a thickness of 11 μm without the inner conductors.

"Disconnection of surface layer electrode" was evaluated with a tester by observing the presence or absence of the electrical connection between the ends of the surface layer electrode at the top of the multilayer ceramic substrate for evaluation. In a case where the electrical connection was present, the case was evaluated as G (Good). In a case where the electrical connection was absent, the case was evaluated as P (Poor).

Regarding "flexural strength", the flexural strength of the multilayer ceramic substrate for evaluation was measured by a three-point bend method. Separately from the above, a sample including only a surface layer portion and a sample including only an inner layer portion were produced. The flexural strength of each sample was measured by the three-point bend method. As described above, the flexural strength of the surface layer portion, the inner layer portion, and the substrate (the whole sintered body) was measured. In a case where the flexural strength of the substrate is equal to or higher than the flexural strength of the inner layer portion, the case was evaluated as G (Good). In a case where the flexural strength of the substrate is lower than the flexural strength of the inner layer portion, the case was evaluated as P (Poor).

Regarding "delamination", the presence of delamination between layers in a cross section of the multilayer ceramic substrate for evaluation was observed under a metallurgical microscope at a magnification of 200× and evaluated. In a case where delamination was not observed in 100 samples, the case was evaluated as G (Good). In a case where delamination was observed even in a single sample, the case was evaluated as P (Poor).

TABLE 3

| | Thermal expansion coefficient [ppmK$^{-1}$] | | | Porosity | | Maximum pore size | | Insulating property of inner layer portion | |
|---|---|---|---|---|---|---|---|---|---|
| | First layer (α1) | Second layer (α2) | Difference α2 − α1 | First layer [%] | Second layer [%] | First layer [μm] | Second layer [μm] | LogIR [Ω] | Evaluation |
| Comparative Example 1 | 6 | 7.4 | 1.4 | 25 | 15 | 11 | 12 | 7 | P |
| Comparative Example 2 | 6.0 | 7.4 | 1.4 | 19 | 15 | 11 | 12 | 7 | P |
| Example 1 | 6.2 | 7.4 | 1.2 | 12 | 14 | 7 | 11 | 11 | G |
| Example 2 | 6.2 | 7.5 | 1.3 | 12 | 8 | 7 | 7 | 11 | G |
| Comparative Example 3 | 6.2 | 7.5 | 1.3 | 12 | 13 | 7 | 14 | 7 | P |
| Example 3 | 7.6 | 7.9 | 0.3 | 6 | 6 | 3 | 4 | 11 | G |
| Example 4 | 5.4 | 5.8 | 0.4 | 12 | 13 | 7 | 9 | 11 | G |
| Example 5 | 6.3 | 7.5 | 1.2 | 8 | 9 | 5 | 6 | 11 | G |
| Example 6 | 6.3 | 7.2 | 0.9 | 8 | 9 | 5 | 6 | 11 | G |
| Example 7 | 6.3 | 7.1 | 0.8 | 8 | 9 | 5 | 6 | 11 | G |
| Example 8 | 6.3 | 6.6 | 0.3 | 8 | 10 | 5 | 7 | 11 | G |
| Example 9 | 6.3 | 6.4 | 0.1 | 8 | 10 | 5 | 7 | 11 | G |
| Example 10 | 5.7 | 7.5 | 1.8 | 8 | 9 | 5 | 6 | 11 | G |
| Example 11 | 5.9 | 6.4 | 0.5 | 8 | 10 | 5 | 7 | 11 | G |
| Example 12 | 6.2 | 6.5 | 0.3 | 8 | 10 | 5 | 7 | 11 | G |
| Example 13 | 5.9 | 6.2 | 0.3 | 8 | 11 | 5 | 8 | 11 | G |
| Example 14 | 7.3 | 7.6 | 0.3 | 6 | 9 | 4 | 5 | 11 | G |
| Example 15 | 6.6 | 7.5 | 0.9 | 12 | 9 | 8 | 5 | 11 | G |
| Comparative Example 4 | 6.6 | 7.5 | 0.9 | 17 | 13 | 13 | 5 | 11 | G |
| Comparative Example 5 | 6.1 | 7.4 | 1.3 | 18 | 15 | 11 | 12 | 7 | P |
| Example 16 | 6.1 | 7.4 | 1.3 | 11 | 13 | 6 | 10 | 11 | G |
| Example 17 | 6.2 | 7.5 | 1.3 | 7 | 8 | 4 | 5 | 11 | G |

TABLE 3-continued

| | | | | | | | | | |
|---|---|---|---|---|---|---|---|---|---|
| Comparative Example 6 | 6.2 | 7.5 | 1.3 | 7 | 15 | 4 | 15 | 8 | P |
| Example 18 | 6.5 | 7.5 | 1.0 | 13 | 8 | 8 | 5 | 11 | G |
| Comparative Example 7 | 6.5 | 7.5 | 1.0 | 17 | 8 | 13 | 5 | 11 | G |

| | Disconnection of surface layer electrode | Flexural strength [MPa] | | | Evaluation | Delamination |
|---|---|---|---|---|---|---|
| | | Surface layer portion | Inner layer portion | Substrate | | |
| Comparative Example 1 | P | 340 | 350 | 400 | G | G |
| Comparative Example 2 | P | 340 | 350 | 400 | G | G |
| Example 1 | G | 335 | 345 | 395 | G | G |
| Example 2 | G | 335 | 340 | 390 | G | G |
| Comparative Example 3 | G | 335 | 340 | 390 | G | G |
| Example 3 | G | 340 | 350 | 410 | G | G |
| Example 4 | G | 320 | 325 | 370 | G | G |
| Example 5 | G | 335 | 340 | 390 | G | G |
| Example 6 | G | 335 | 340 | 390 | G | G |
| Example 7 | G | 335 | 340 | 390 | G | G |
| Example 8 | G | 335 | 340 | 390 | G | G |
| Example 9 | G | 335 | 340 | 335 | P | G |
| Example 10 | G | 325 | 340 | 370 | G | P |
| Example 11 | G | 325 | 345 | 400 | G | G |
| Example 12 | G | 340 | 345 | 400 | G | G |
| Example 13 | G | 325 | 320 | 380 | G | G |
| Example 14 | G | 340 | 340 | 410 | G | G |
| Example 15 | G | 335 | 340 | 390 | G | G |
| Comparative Example 4 | P | 310 | 340 | 370 | G | G |
| Comparative Example 5 | P | 340 | 350 | 400 | G | G |
| Example 16 | G | 335 | 340 | 390 | G | G |
| Example 17 | G | 335 | 340 | 390 | G | G |
| Comparative Example 6 | G | 335 | 340 | 390 | G | G |
| Example 18 | G | 335 | 340 | 390 | G | G |
| Comparative Example 7 | P | 335 | 340 | 390 | G | G |

As described in Table 2 and Table 3, in Examples 1 to 15, in which the first layer has a porosity of 13% or less and a maximum pore size of 10 μm or less and in which the second layer has a porosity of 14% or less and a maximum pore size of 11 μm or less, disconnection of the surface layer electrode does not occur. From the results of Examples 1 to 15, it has been found that when the composition ratio of glass and/or the amount of metal oxide or alumina is changed, the effect of suppressing disconnection of the surface layer electrode can be exhibited.

In particular, in Examples 1 to 8 and 11 to 15, the amount of CuO in the first layer is equal to or larger than the amount of CuO in the second layer, and the difference in thermal expansion coefficient between the first layer and the second layer is 0.3≤α2−α1≤1.5. Thus, the insulating property of the inner layer portion is reliably obtained, the flexural strength of the substrate is higher than the flexural strength of the inner layer portion, and delamination does not occur.

In Example 9, in which the difference in thermal expansion coefficient between the first layer and the second layer, α2−α1, is 0.1, disconnection of the surface layer electrode does not occur; however, the flexural strength of the substrate is lower than the flexural strength of the inner layer portion.

In Example 10, in which the difference in thermal expansion coefficient between the first layer and the second layer, α2−α1, is 1.8, disconnection of the surface layer electrode does not occur; however, delamination occurs.

On the other hand, in Comparative Example 1, in which the materials of the first layer and the second layer contain neither CuO nor Ag$_2$O, which are metal oxides, the porosity of the first layer and the second layer increases, and the maximum pore size of the first layer and the second layer also increases. Thus, disconnection of the surface layer electrode occurs, and the insulating property of the inner layer portion decreases.

In Comparative Example 2, in which the material of the first layer contains a metal oxide that is CuO and in which the material of the second layer does not contain a metal oxide, vitrification is not sufficiently promoted. Thus, the porosity of the first layer and the second layer increases, and the maximum pore size of the first layer and the second layer also increases. As a result, disconnection of the surface layer electrode occurs, and the insulating property of the inner layer portion decreases.

In Comparative Example 3, in which the amount of CuO in the first layer is smaller than the amount of CuO in the second layer, the maximum pore size of the second layer increases. Thus, disconnection of the surface layer electrode does not occur; however, the insulating property of the inner layer portion decreases.

In Comparative Example 4, in which the amount of CuO in the first layer is 11 weight %, the porosity of the first layer increase, and the maximum pore size of the first layer also increases. Thus, disconnection of the surface layer electrode occurs.

In Examples 16 to 18, in which the first layer has a porosity of 13% or less and a maximum pore size of 10 μm or less and in which the second layer has a porosity of 14% or less and a maximum pore size of 11 μm or less, disconnection of the surface layer electrode does not occur. From the results of Examples 16 to 18, when Ag$_2$O is used as a metal oxide, the effect of suppressing disconnection of the surface layer electrode can be exhibited as well as when CuO is used.

In particular, in Examples 16 to 18, the amount of Ag$_2$O in the first layer is larger than the amount of Ag$_2$O in the second layer, and the difference in thermal expansion coefficient between the first layer and the second layer is 0.3≤α2−α1≤1.5. Thus, the insulating property of the inner layer portion is reliably obtained, the flexural strength of the substrate is higher than the flexural strength of the inner layer portion, and delamination does not occur.

On the other hand, in Comparative Example 5, in which the material of the first layer contains a metal oxide that is $Ag_2O$ and in which the material of the second layer does not contain a metal oxide, vitrification is not sufficiently promoted. Thus, the porosity of the first layer and the second layer increases, and the maximum pore size of the first layer and the second layer also increases. As a result, disconnection of the surface layer electrode occurs, and the insulating property of the inner layer portion decreases.

In Comparative Example 6, in which the amount of $Ag_2O$ in the second layer is 4 weight %, the porosity of the second layer increases, and the maximum pore size of the second layer increases. Thus, the insulating property of the inner layer portion decreases.

In Comparative Example 7, in which the amount of $Ag_2O$ in the first layer is 11 weight %, the porosity of the first layer increases, and the maximum pore size of the first layer also increases. Thus, disconnection of the surface layer electrode occurs.

REFERENCE SIGNS LIST

A electronic device
1, 2 multilayer ceramic substrate
10 inner layer portion
20, 30 surface layer portion
21, 31 first layer
22, 32 second layer
41, 42 surface layer electrode
43, 43a, 43b inner conductor
44, 44a, 44b via-hole conductor
100 composite laminate
110 inner-layer ceramic green sheet
120, 130 surface-layer ceramic green sheet
151, 152 restricting ceramic green sheet

The invention claimed is:

1. A multilayer ceramic substrate comprising:
a first layer positioned at a surface of the multilayer ceramic substrate, the first layer having a first porosity of 13% or less and a first maximum pore size of 10 μm or less, and having a first composition containing a first metal oxide that is at least one selected from CuO and $Ag_2O$;
a second layer adjacent the first layer and positioned inward of the surface of the multilayer ceramic substrate, the second layer having a second porosity of 14% or less and a second maximum pore size of 11 μm or less, and having a second composition containing a second metal oxide that is at least one selected from CuO and $Ag_2O$; and
a surface layer electrode disposed on a surface of the first layer, wherein
the first composition of the first layer is different from the second composition of the second layer, and
a first amount of the first metal oxide in the first layer is larger than a second amount of the second metal oxide in the second layer.

2. The multilayer ceramic substrate according to claim 1, wherein the first porosity is 8% or less.

3. The multilayer ceramic substrate according to claim 2, wherein the first maximum pore size is 7 μm or less.

4. The multilayer ceramic substrate according to claim 1, wherein the first maximum pore size is 7 μm or less.

5. The multilayer ceramic substrate according to claim 1, wherein the first maximum pore size is 1 μm to 10 μm.

6. The multilayer ceramic substrate according to claim 1, wherein the first porosity is 1% to 13%.

7. The multilayer ceramic substrate according to claim 1, wherein the second porosity is 9% or less.

8. The multilayer ceramic substrate according to claim 1, wherein the second porosity is 2% to 14%.

9. The multilayer ceramic substrate according to claim 1, wherein the second maximum pore size is 2 μm to 11 μm.

10. The multilayer ceramic substrate according to claim 5, wherein the second maximum pore size is 9 μm or less.

11. The multilayer ceramic substrate according to claim 1, wherein the second maximum pore size is 9 μm or less.

12. The multilayer ceramic substrate according to claim 1,
wherein a first thermal expansion coefficient of the first layer is lower than a second thermal expansion coefficient of the second layer,
the first composition of the first layer further contains glass containing 40 weight % to 65 weight % of at least one selected from CaO, MgO, SrO, and BaO, and alumina; and
the second composition of the second layer further contains glass containing 40 weight % to 65 weight % of at least one selected from CaO, MgO, SrO, and BaO, and alumina,
an amount of the alumina in each of the first composition and the second composition is 35 weight % to 60 weight % relative to a total weight of the glass and the alumina,
an amount of the first metal oxide is 1 weight % to 10 weight % relative to the total weight of the glass and the alumina in the first composition, and
an amount of the second metal oxide is 1 weight % to 10 weight % relative to the total weight of the glass and the alumina in the second composition.

13. The multilayer ceramic substrate according to claim 1, wherein a first thermal expansion coefficient of the first layer is lower than a second thermal expansion coefficient of the second layer, and when the first thermal expansion coefficient of the first layer is expressed as α1 [ppmK$^{-1}$] and the second thermal expansion coefficient of the second layer is expressed as α2 [ppmK$^{-1}$], 0.3 ≤ α2−α1 ≤ 1.5.

14. An electronic device comprising the multilayer ceramic substrate according to claim 1.

15. The multilayer ceramic substrate according to claim 1, wherein a first thermal expansion coefficient of the first layer is lower than a second thermal expansion coefficient of the second layer.

16. The multilayer ceramic substrate according to claim 1, wherein
the first composition of the first layer further contains glass containing 40 weight % to 65 weight % of at least one selected from CaO, MgO, SrO, and BaO, and alumina; and
the second composition of the second layer further contains glass containing 40 weight % to 65 weight % of at least one selected from CaO, MgO, SrO, and BaO, and alumina.

17. The multilayer ceramic substrate according to claim 16, wherein
an amount of the alumina in each of the first composition and the second composition is 35 weight % to 60 weight % relative to a total weight of the glass and the alumina, an amount of the first metal oxide is 1 weight % to 10 weight % relative to the total weight of the glass and the alumina in the first composition, and an amount of the second metal oxide is 1 weight % to 10 weight % relative to the total weight of the glass and the alumina in the second composition.

\* \* \* \* \*